(12) United States Patent
Martinez et al.

(10) Patent No.: US 8,304,345 B2
(45) Date of Patent: Nov. 6, 2012

(54) GERMANIUM LAYER POLISHING

(75) Inventors: Muriel Martinez, Saint Egreve (FR); Pierre Bey, Livron sur Drome (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 12/933,666

(22) PCT Filed: Jun. 9, 2009

(86) PCT No.: PCT/FR2009/051081
§ 371 (c)(1),
(2), (4) Date: Nov. 3, 2010

(87) PCT Pub. No.: WO2010/001028
PCT Pub. Date: Jan. 7, 2010

(65) Prior Publication Data
US 2011/0045654 A1    Feb. 24, 2011

(30) Foreign Application Priority Data
Jun. 10, 2008    (FR) .................................... 08 53826

(51) Int. Cl.
*H01L 21/302* (2006.01)
*H01L 21/461* (2006.01)
(52) U.S. Cl. ............... 438/693; 438/959; 257/E21.304
(58) Field of Classification Search .......... 438/690–693, 438/959; 257/E21.304
See application file for complete search history.

(56) References Cited

U.S. PATENT DOCUMENTS

| 3,429,080 | A | 2/1969 | Lachapelle .................. 51/309 |
| 3,922,393 | A | 11/1975 | Sears, Jr. .................... 427/215 |
| 6,833,195 | B1 * | 12/2004 | Lei et al. ..................... 428/458 |
| 6,988,936 | B2 | 1/2006 | Filipozzi et al. .............. 451/41 |
| 2002/0019202 | A1 | 2/2002 | Thomas et al. .............. 451/57 |
| 2004/0194392 | A1 * | 10/2004 | Takemiya et al. ........... 51/307 |
| 2005/0070078 | A1 | 3/2005 | Daval et al. ................. 438/542 |
| 2007/0087570 | A1 * | 4/2007 | Martinez et al. ............ 438/692 |
| 2007/0262296 | A1 * | 11/2007 | Bauer .......................... 257/19 |
| 2009/0014415 | A1 * | 1/2009 | Chelle et al. ................ 216/53 |

FOREIGN PATENT DOCUMENTS

| FR | 2 860 340 | | 4/2005 |
| FR | 2912841 | A1 * | 8/2008 |
| JP | 11-197583 | | 7/1999 |
| WO | WO 2005/120775 | A1 | 12/2005 |
| WO | WO 2006/032298 | A1 | 3/2006 |
| WO | WO 2008/099245 | A1 | 8/2008 |

OTHER PUBLICATIONS

International Search Report, PCT/FR2009/051081, mailed Oct. 28, 2009.

(Continued)

*Primary Examiner* — Leonard Chang
(74) *Attorney, Agent, or Firm* — Winston & Strawn LLP

(57) ABSTRACT

The invention relates to improvements in the polishing of a layer of germanium by a method which includes a first step of chemical-mechanical polishing of the surface of the germanium layer that is carried out with a first polishing solution having an acidic pH. The first polishing step is then followed by a second step of chemical-mechanical polishing of the surface of the germanium layer carried out with a second polishing solution having an alkaline pH. The polished heteroepitaxial germanium layer has a surface microroughness of less than 0.1 nm RMS and a surface macroroughness corresponding to a surface haze level of less than 0.5 ppm.

18 Claims, 4 Drawing Sheets

OTHER PUBLICATIONS

Gianni Taraschi et al.,"Strained Si, SiGe and Ge on-insulator: review of wafer bonding fabrication techniques", Solid State Electronics, vol. 48, pp. 1297-1305, (2004).

International Search Report, PCT/IB2008/000156, dated Jun. 2, 2008.

Sawano K. et al., "Mobility enhancement in strained Ge heterostructures by planarization of SiGe buffer layers grown on Si substrates", Japanese Journal of Applied Physics, vol. 44, No. 43, pp. L1320-L1322, (2005).

Ming-Shan Shieh et al., "The CMP process and cleaning solution for planarization of strain-relaxed SiGe virtual substrates in MOSFET applications", Journal of the Electrochemical Society Electrochem. Soc., USA, vol. 153, No. 2, pp. G144-G148, (2006).

* cited by examiner

GERMANIUM LAYER POLISHING

This application is a 371 filing of International Patent Application PCT/FR2009/051081 filed Jun. 9, 2009.

TECHNICAL FIELD AND PRIOR ART

The present invention relates to the polishing of germanium layers. Germanium is a material which is relatively difficult to polish, whether it is in bulk form (Ge bulk) or obtained by heteroepitaxy on a substrate, for example made of silicon.

In the latter case, when the germanium layer is produced by heteroepitaxy, the crystal lattice mismatch, also referred to as the lattice parameter difference, between the silicon substrate and the epitaxially grown layer of germanium leads to the formation of a dislocated zone (misfit dislocations) at the interface between the silicon substrate and the germanium layer, which leads to the appearance of defects on the surface of the germanium layer, for example a strain network referred to as "cross-hatch". These defects increase the surface roughness of the epitaxially grown germanium layer.

The surface of the germanium layer should therefore be polished in order to eliminate the potential defects resulting from the epitaxial growth (for example cross-hatch) and to reduce the surface roughness, particularly with a view to bonding the germanium layer by molecular adhesion, for example in the case of fabricating a GeOI (germanium on insulator) structure. The technique most commonly used for polishing or planarizing epitaxially grown layers is chemical-mechanical polishing (CMP), a well-known polishing technique which employs a fabric in combination with a polishing solution containing both an agent (e.g. $NH_4OH$) capable of chemically attacking the surface of the layer and abrasive particles (e.g. silica particles) capable of mechanically attacking the said surface.

Polishing the surface of germanium is relatively difficult, however, in particular when the intention is to obtain a surface condition compatible with bonding by molecular adhesion. The document "Strained Si, SiGe, and Ge on-insulator: review of wafer bonding fabrication techniques" by Gianni Taraschi et al., Solid-State Electronics, Vol. 48, Issue 8, Pages 1297-1305 proposes, for example, to deposit an oxide layer on a layer containing germanium, because the oxide layer is easier to polish with a view to bonding by molecular adhesion.

Documents U.S. Pat. No. 6,988,936 and JP 11 197583 describe methods of finishing or recycling by chemical-mechanical polishing of a silicon layer of an SOI (silicon on insulator) structure obtained by the SmartCut™ method. However, these methods are not suitable for heterogeneous structures comprising a germanium surface layer. This is because the material removal rate or factor obtained with these methods on silicon decreases by more than a factor of 5 when germanium is involved.

Document U.S. Pat. No. 3,429,080 describes a chemical-mechanical polishing method in which an oxidizing agent is added to the polishing solution in order to increase the rate of removal. Still with a view to increasing the rate of removal, document U.S. Pat. No. 3,922,393 proposes to use a polishing solution having a pH between 11 and 12.5 and containing silica particles covered with aluminium atoms.

However, the removal rates obtained with the solutions disclosed in these documents remain relatively slow, and are not suitable for removing the surface defects produced by epitaxial growth.

Furthermore, although the polishing methods described in these documents make it possible to reduce the surface microroughness, they do not however ensure a level of surface macroroughness which is sufficient to satisfy the quality demands required in particular for carrying out adhesion by molecular bonding.

In fact, the applicant has observed that the surface macroroughness level determined by measuring the surface "haze" (low-frequency spatial signal due to the light scattered by the surface defects when the wafer or heterostructure is illuminated for example in a measuring apparatus of the SP1 type) is just as important a parameter as the surface microroughness level for qualifying the surface condition of a structure. Since the requirements in terms of surface roughness on heteroepitaxial germanium layers after chemical-mechanical polishing are becoming more and more stringent, characterization of the surface of these structures must also take the macroroughness measurement into account. Characterizations of heteroepitaxial germanium layers carried out at a low spatial frequency, that is to say by measuring the surface haze which is representative of the large-scale (full wafer) surface roughness, have made it possible to demonstrate that there is a direct correlation between the surface macroroughness (haze level measured by SP1) and the final quality of the product. The technique used for measuring the haze level of wafers is described particularly in the document "Monitoring and Qualification Using Comprehensive Surface Haze Information" by Holsteyns, F. et al., Semiconductor Manufacturing, 2003 IEEE International Symposium, p. 378-381.

There is consequently a need to improve the rate of removal as well as the level of surface roughness when polishing germanium layers (heteroepitaxial or bulk).

SUMMARY OF THE INVENTION

The present invention overcomes the drawbacks mentioned above and provides a solution for the polishing of germanium layers having an increased rate of removal while also making it possible to further reduce the level of roughness present on the surface of germanium layers.

These advantages are achieved with the inventive method for polishing a structure comprising at least one surface layer of germanium, in which method a first step of chemical-mechanical polishing of the surface of the germanium layer is carried out with a first polishing solution having an acidic pH, this first step being followed by a second step of chemical-mechanical polishing of the surface of the germanium layer carried out with a second polishing solution having an alkaline pH.

By using a polishing solution having an acidic pH during a first chemical-mechanical polishing step, a much higher rate of germanium removal is obtained than with a polishing solution conventionally used for this type of material, namely a solution having an alkaline pH. In the case of a germanium layer formed by heteroepitaxy, this first polishing step makes it possible initially to remove enough germanium in order to eliminate the surface defects due to the epitaxial growth of the germanium layer and to reduce the surface roughness in part. The second polishing step makes it possible to significantly reduce the microroughness and the macroroughness of the surface of the germanium layer, in particular the haze. After this second polishing step, the germanium layer has a surface roughness level compatible with bonding by molecular adhesion.

According to one aspect of the invention, the first chemical-mechanical polishing step is carried out with a polishing fabric having a first compressibility factor, and the second chemical-mechanical polishing step is carried out with a polishing fabric having a second compressibility factor higher than the said first compressibility factor.

During the first polishing step, it is preferable to use a "hard" polishing fabric, for example having a compressibility factor of between 2% and 4%, and in particular 2%. Although a fabric with such hardness (2%) results in a microroughness (AFM 40*40 µm$^2$) greater than that obtained with a fabric having an "intermediate" compressibility factor, for example 6% as recommended in document WO2005/120775, the combination of the two steps of the method according to the invention makes it possible to eliminate more efficiently both the network of strains referred to as "cross-hatch" and the surface microroughness and macroroughness referred to as "haze".

More precisely, the defects constituting the cross-hatch are aligned with the crystal lattice and are therefore particularly stable and difficult to planarize, whereas the randomly arranged components of the microroughness are easier to eliminate. When the first polishing step is carried out with a very hard fabric, it is found that the cross-hatch actually disappears even though the microroughness remains globally high, in particular with respect to its randomly arranged components which correspond for example to hardened zones due to the polishing. Indeed, randomly arranged forms of surface corrugations are observed whereas the cross-hatch clearly has a correlation with the crystalline axes. The random microroughness is then eliminated during the second polishing step, which preferably comprises the use of an intermediate polishing fabric having, for example, a compressibility factor of between 5 and 9%, and in particular 6%.

Furthermore, by virtue of the elimination of the cross-hatch during the first polishing step, the second polishing step makes it possible to reduce the global microroughness to a level lower than in the case of a method aiming to minimize the microroughness directly in a single step, which does not allow the cross-hatch to be eliminated completely.

According to one aspect of the invention, the first polishing solution comprises silica particles having a diameter lying in a first range of values, and the second polishing solution comprises silica particles having a diameter lying in a second range of values at least in part lower than the values of the first value range. During the first polishing step, the silica particles of the polishing solution may have a diameter of between 40 nm and 60 nm, whereas during the second polishing step the silica particles of the polishing solution may have a diameter of between 30 nm and 40 nm.

According to one aspect of the invention, the first and second polishing solutions respectively have a silica particle concentration of between 30 and 28%.

The structure to be polished according to the method of the invention may comprise a layer of bulk germanium (Ge bulk) or a heteroepitaxial layer of germanium on a substrate made of a material different from that of the said heteroepitaxial layer.

In the case of germanium layer obtained by heteroepitaxy, after the second chemical-mechanical polishing step the heteroepitaxial germanium layer has a surface microroughness of less than 0.1 nm RMS for a roughness measurement carried out using an atomic force microscope on scan areas of 2*2 µm$^2$ and 10*10 µm$^2$.

Furthermore, after the second chemical-mechanical polishing step, the heteroepitaxial germanium layer has a surface macroroughness corresponding to a surface haze level of less than 0.5 ppm.

The polishing method of the invention, as described above, may advantageously be used during the fabrication of a GeOI structure according to the well-known SmartCut™ technology, this fabrication comprising in particular bonding by molecular adhesion the exposed surface of the germanium layer on a receiver substrate, which bonding is made possible by prior polishing of the exposed face of the germanium layer carried out according to the polishing method of the present invention. The polishing method of the invention furthermore makes it possible to obtain GeOI wafers of very high quality, and consequently to reduce the number of wafers rejected.

According to one aspect of the invention, the receiver substrate comprises a thermal oxide layer on its face intended to be bonded to the strained silicon layer. The oxide layer is conventionally produced on the donor substrate, before bonding, by means of an oxidation step of the TEOS type which is complicated to carry out. On the other hand, the oxide layer may be produced on the receiver substrate, before bonding, by means of a step of thermally oxidizing the receiver substrate made of bulk silicon. This, however, requires a very good surface condition of the germanium layer. By virtue of the method according to the invention, a surface quality of the germanium layer is achieved, particularly as regards the phenomena of cross-hatch and haze, which makes it possible to bond the germanium directly onto a receiver substrate comprising the thermal oxide layer.

The present invention also relates to a heterostructure comprising at least one heteroepitaxial layer of germanium on a silicon substrate, the heteroepitaxial layer having a surface microroughness of less than 0.1 nm RMS for a roughness measurement carried out using an atomic force microscope on scan areas of 2*2 µm$^2$ and 10*10 µm$^2$.

The heteroepitaxial layer also has a surface macroroughness corresponding to a surface haze level of less than 0.5 ppm.

DETAILED EXPLANATION OF EMBODIMENTS OF THE INVENTION

Figure 1:
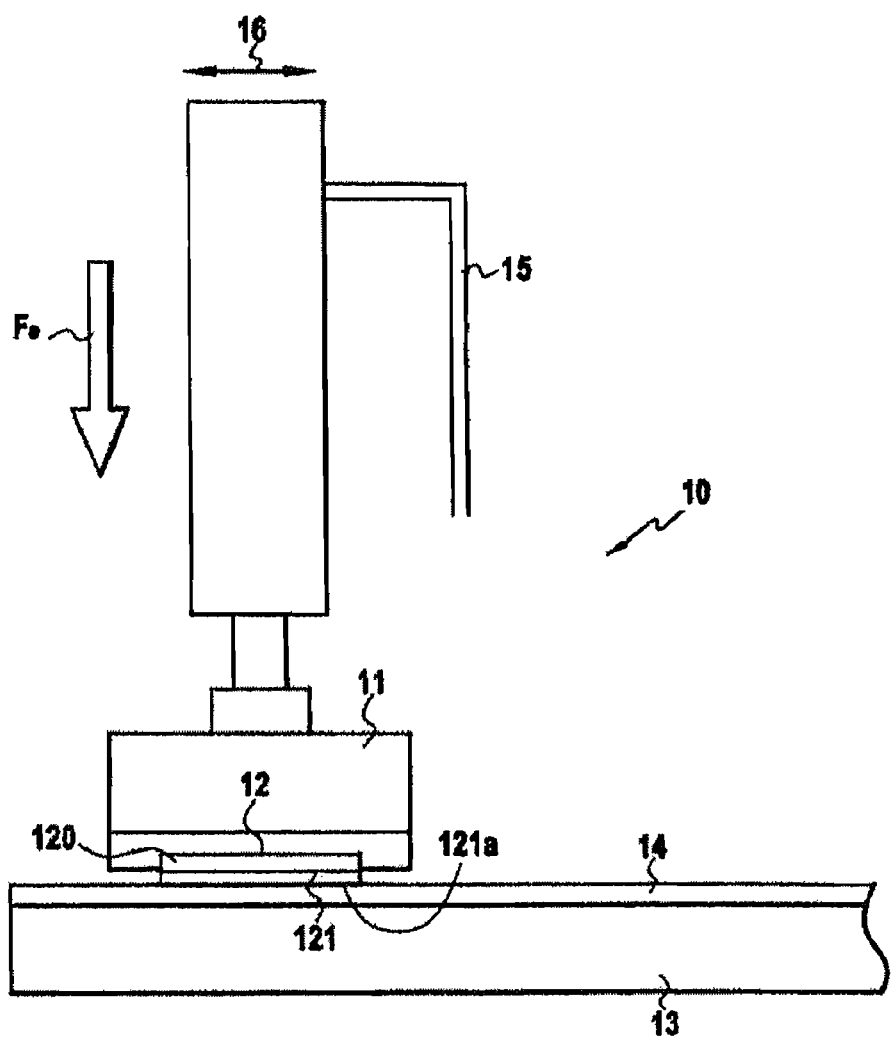
FIG. 1 is a schematic representation of a polishing tool which can be used for carrying out the polishing method according to an embodiment of the invention.

The method for polishing a germanium layer of the present invention comprises two chemical-mechanical polishing steps, also referred to as CMP polishing, which are carried out consecutively but under different operating conditions. In particular, the first polishing step is carried out with a first polishing solution having an acidic pH, whereas the second polishing step is carried out with a second polishing solution having an alkaline pH.

More particularly, the first and second polishing solutions contain at least colloidal silica particles and a compound for suspending these particles. A compound having an acidic pH is chosen for the first polishing solution, whereas a compound having an alkaline pH is chosen for the second polishing solution. By way of example, the abrasive solution 30H50 from "Rohm and Haas Company", USA, may be used for the first polishing solution, and the abrasive solution Klebosol 1508-35 from "Rohm and Haas Company" may be used for the second polishing solution.

The first polishing solution, used during the first polishing step, preferably consists of a colloidal suspension of stabilized amorphous silica in an acidic medium having a pH between 2 and 3, for example hydrochloric acid HCl or phosphoric acid $H_3PO_4$.

The second polishing solution, used during the second polishing step, preferably consists of a colloidal suspension of stabilized amorphous silica in an alkaline medium having a pH of between 10 and 11, for example potassium hydroxide KOH or ammonium hydroxide $NH_4OH$.

The first polishing step is furthermore carried out with a relatively "hard" polishing fabric, that is to say one having a low compressibility factor. A low compressibility factor is intended to mean a low factor compared with the fabrics which are suitable for polishing a predetermined material. In any event, the first compressibility factor is low compared with the second compressibility factor, which is classed as "intermediate" for the fabric used during the second polishing step. For a heteroepitaxial layer of germanium, for example, a fabric with a compressibility of between 2% and 4% is considered hard, whereas a compressibility of between 5% and 9%, and in particular 6%, is defined as intermediate.

During the first polishing step, the silica particles of the polishing solution have a diameter lying in a first range of values varying for the most part or on average between 40 nm and 60 nm, approximately, whereas during the second polishing step the silica particles of the second polishing solution have a diameter lying in a second range of values varying for the most part or on average between 30 nm and 40 nm, approximately. Partial overlap of the ranges is not excluded, because the particles of a particular solution never all have the same diameter, and it is common that the distributions of the diameters of different solutions overlap.

Furthermore, the two polishing solutions have a silica particle concentration of between 28% and 30%, approximately, in the two polishing steps.

FIG. 1 illustrates a polishing tool which can be used for carrying out the polishing method according to an embodiment of the invention. The tool 10 comprises, on the one hand, a polishing head 11 into which a heterostructure 12 having a surface roughness to be polished is inserted and, on the other hand, a plate 13 covered with a polishing fabric 14. The polishing head 11 and the plate 13 are respectively driven in rotation in order to polish the surface 121a of the heterostructure 12 in contact with the polishing fabric 14. A polishing pressure Fe and a translational movement, represented by an arrow 16, are furthermore applied to the head 11 during the polishing. During the polishing, a polishing solution corresponding to the first or second polishing solution according to the invention is furthermore injected through a conduit 15 into the polishing head 11, and dispensed by the latter onto the polishing fabric 14. The polishing of the surface 121a of the heterostructure 12 is consequently carried out with the polishing fabric 14 impregnated with the polishing solution.

Figure 2:
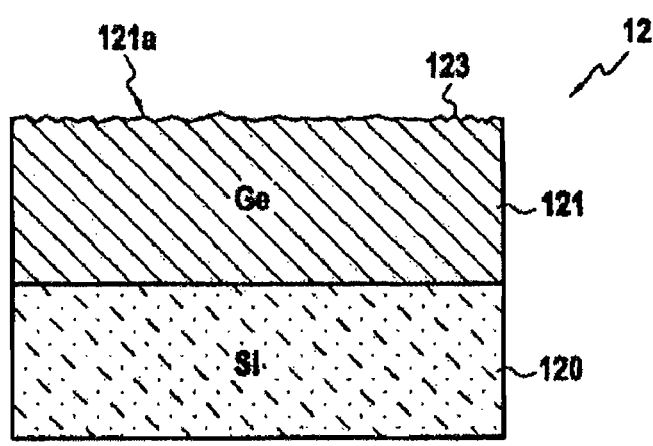
FIG. 2 is a schematic view in section of a heterostructure comprising a germanium layer formed by heteroepitaxy on a silicon substrate.

As illustrated in FIG. 2, the heterostructure 12 consists of at least one heteroepitaxial layer of germanium 121 formed on a substrate 120 made of a different material, here a silicon substrate, the heteroepitaxial layer having on its surface 121a a surface roughness 123 which should be reduced in particular to a level that allows bonding by molecular adhesion. This is because the crystal lattice mismatch between the silicon substrate 120 and the germanium layer 121 formed by heteroepitaxy thereon leads, during the strain relaxation, to the formation of a relaxation roughness 123 (cross-hatch) on the surface of the germanium layer 121 corresponding to the surface 121a of the heterostructure 12. After reduction of the surface roughness and elimination of the potential defects due to the epitaxy, according to the polishing method of the invention as described below, the heterostructure 12 can be used as a donor substrate in order to transfer a part of the germanium layer onto a receiver substrate, for example by using the well-known SmartCut™ technology.

As indicated above, the first chemical-mechanical polishing step is carried out with a first polishing solution which consists of a colloidal suspension of stabilized amorphous silica in an acidic medium and has a pH preferably between 2 and 3. This type of solution corresponds to the polishing solutions conventionally used for polishing metals, such as tungsten, because it makes it possible to induce oxidation-reduction reactions of the metals, thus promoting the removal of material.

In the present invention, the use of such a solution for polishing germanium makes it possible to multiply the rate of removal by a factor of 6 compared with polishing carried out with the polishing solutions which are conventionally used for polishing materials such as silicon oxide and have an alkaline pH.

In the first polishing solution, the concentration of silica particles lies between 28% and 30%, and the silica particles have a diameter of between 40 nm and 60 nm.

In the first polishing step, the surface of the heterostructure 12 undergoes chemical-mechanical polishing carried out with the first polishing solution as described above and with a so-called "hard" polishing fabric, that is to say a fabric having a compressibility factor of between 2% and 4%, and preferably 2%.

The rate of removal during the first polishing step is approximately 15 Å/sec, and the duration of the first step is about 2 minutes.

This first chemical-mechanical polishing step makes it possible to eliminate principally the cross-hatch and reduce the surface microroughness.

After this first polishing step, however, the heterostructure 12 has on its surface 121a a level of macroroughness of between 7 ppm and 25 ppm, approximately, which corresponds to the level of surface "haze" measured (low-frequency spatial signal due to the light scattered by the surface defects when the wafer or heterostructure is illuminated for example in a measuring apparatus of the SP1 type (KLA-Tencor®)).

According to the invention, a second chemical-mechanical polishing step is thus carried out in order to reduce the level of macroroughness (haze) present on the surface of the heterostructure as well as the level of microroughness The second chemical-mechanical polishing step is carried out with a second polishing solution which consists of a colloidal suspension of stabilized amorphous silica in an alkaline medium and has a pH of between 10 and 11. This type of solution corresponds to the polishing solutions conventionally used for polishing silicon oxide. This second polishing solution is "softer" than that used in the first step and it also contains a concentration of silica particles between 28% and 30%, although they have a diameter of between 30 nm and 40 nm.

This second step of polishing the surface 121a of the heterostructure 12 is furthermore carried out with a so-called "intermediate" polishing fabric, that is to say a fabric having a compressibility factor of between 5% and 9%, preferably 6%. In this second example, the polishing fabric preferably corresponds to the fabric used for the finish polishing of silicon in the fabrication of SOI (silicon on insulator) structures. A known example of such a polishing fabric is the fabric SPM 3100 supplied by Rohm and Haas.

The rate of removal during the second polishing step is preferably 5 Å/sec, and the duration of the second step is approximately 2 minutes.

Even though the rate of removal during this second polishing step is lower than during the first step, this second "finishing" step makes it possible to obtain on the surface 121a of the heterostructure 12 a level of surface macroroughness of the order of 0.5 ppm, corresponding to the level of surface haze measured with a measuring apparatus of the SP1 type. This second step also makes it possible to reduce the surface microroughness to a value of less than 0.1 nm RMS, this roughness value being measured using an atomic force microscope (AFM) with scans of $2*2 \mu m^2$.

Figure 3:
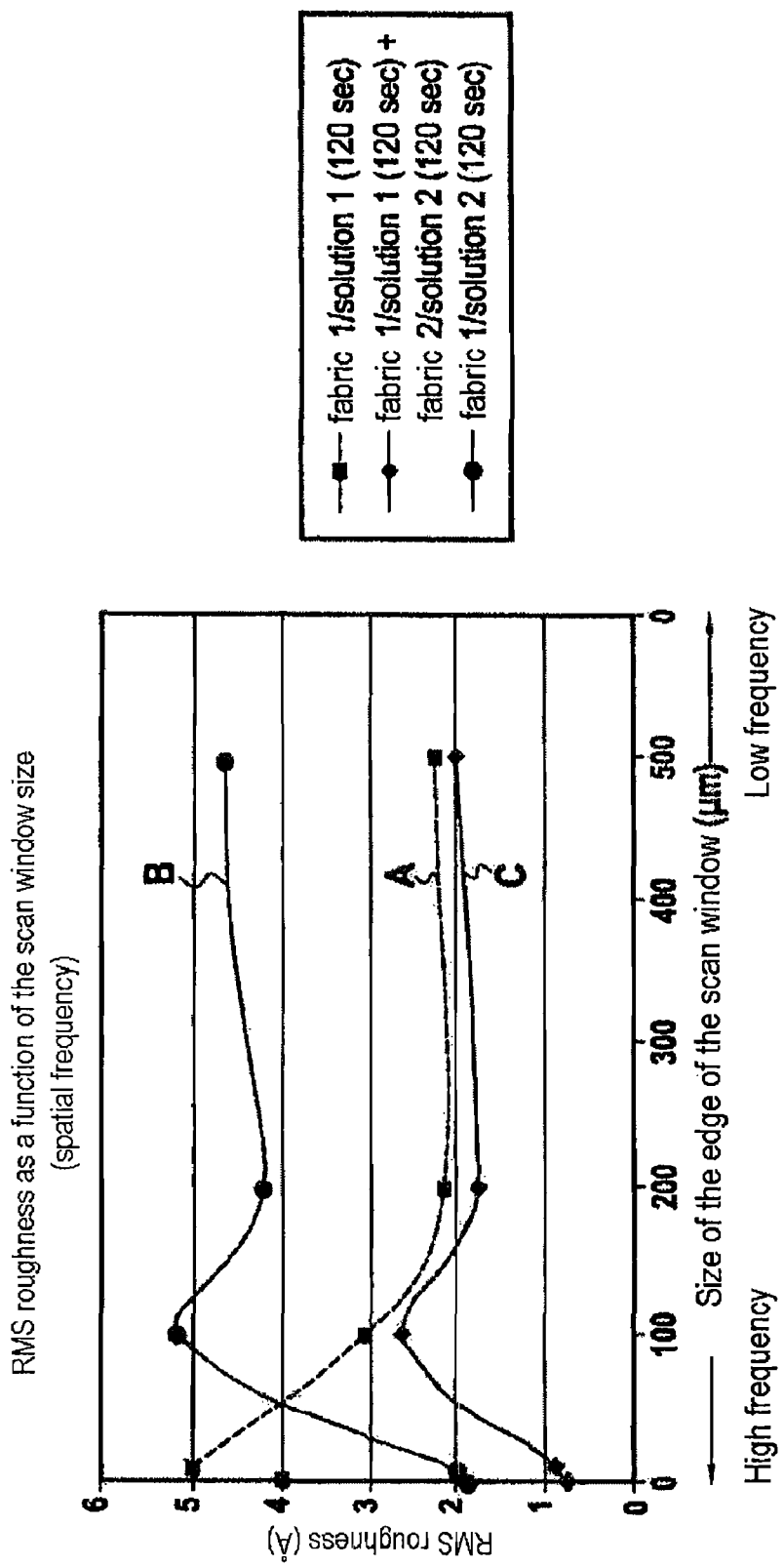
FIG. 3 is a diagram showing roughness levels obtained after the polishing operations carried out either in a single step, or in two steps according to the invention.

FIG. 3 shows the RMS values of surface roughness obtained after polishing a layer of germanium formed by epitaxial growth on a silicon substrate, as in the heterostructure 12 described above, the polishing being carried out respectively:

- in a single step with a fabric and a polishing solution corresponding to those used in the first polishing step as described above (hard fabric (fabric 1) and colloidal suspension of stabilized amorphous silica in an acidic medium (solution 1)) (curve A),
- in a single step with a fabric corresponding to that used in the first polishing step as described above (hard fabric (fabric 1)) and a polishing solution corresponding to that used during the second polishing step (colloidal suspension of stabilized amorphous silica in an alkaline medium) (solution 2)) (curve B), and
- in two steps according to the invention (first step with a hard fabric (fabric 1) and colloidal suspension of stabilized amorphous silica in an acidic medium (solution 1) followed by a second step with an intermediate fabric (fabric 2) and a colloidal suspension of stabilized amorphous silica in an alkaline medium (solution 2)) (curve C).

The surface roughness values presented were measured using an atomic force microscope (AFM) for different spatial frequencies, that is to say for larger or smaller scan areas (measurement scans). The measurements carried out on small scan areas are referred to as "high-frequency" measurements whereas the measurements carried out for large scan areas are referred to as "low frequency" measurements.

Curve A of FIG. 3 shows that the polishing carried out in a single step corresponding to the first step of the method of the invention (hard fabric and a colloidal suspension of stabilized amorphous silica in an acidic medium) corrects the roughness very well for the low-frequency measurements (RMS roughness close to 2 Å) whereas the roughness found for the high-frequency measurements remains large (RMS roughness of the order of 4 to 5 Å for measurements carried out using an atomic force microscope (AFM) on scan areas of $2*2 \mu m^2$ and $10*10 \mu m^2$).

Curve B shows that the opposite effect is obtained when the polishing is carried out in a single step but with a polishing solution corresponding to that used during the second polishing step of the invention (colloidal suspension of stabilized amorphous silicon in an alkaline medium). Specifically, this polishing corrects the roughness very well for the high-frequency measurements (RMS roughness close to 2 Å) whereas the roughness found for the low-frequency measurements remains large (RMS roughness of the order of 4 to 5 Å for measurements carried out using an atomic force microscope (AFM) on scan areas of $500*500 \mu m^2$).

Finally, curve C shows that the polishing in two steps according to the invention (first step with a hard fabric and colloidal suspension of stabilized amorphous silica in an acidic medium followed by a second step with an intermediate fabric and a colloidal suspension of stabilized amorphous silica in an alkaline medium) makes it possible to obtain a good level of roughness for both the low-frequency and high-frequency measurements. More precisely, after the polishing of the invention in two steps, a surface microroughness and macroroughness are obtained which are of the order of 1 to 2 Å RMS, irrespective of the spatial wavelength. These values of microroughness and macroroughness make it possible to have a surface condition of the germanium layer which is compatible with bonding by molecular adhesion.

Figure 4:
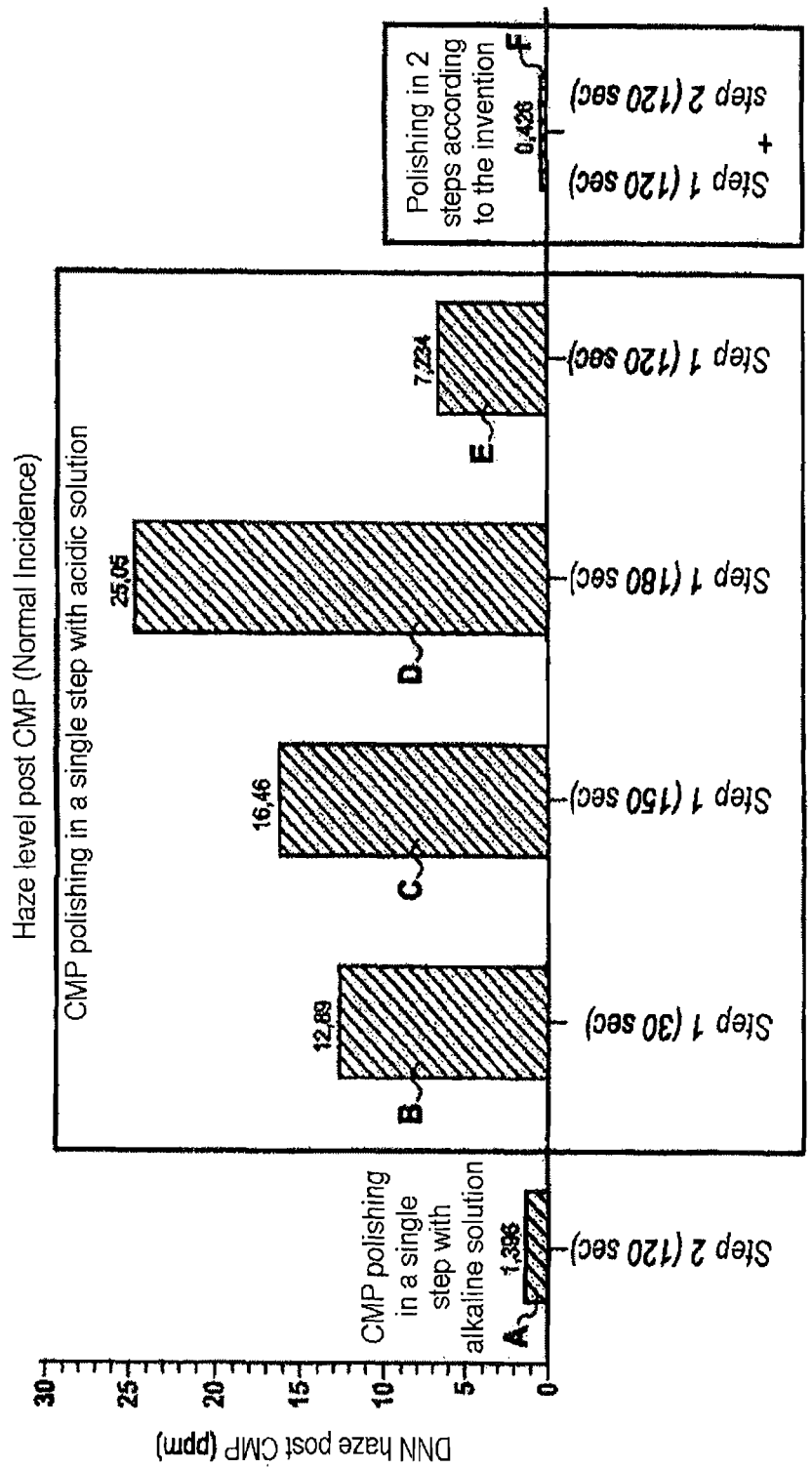
FIG. 4 is a histogram showing haze levels obtained after polishing operations carried out either in a single step, or in two steps according to the invention.
Figure 5:
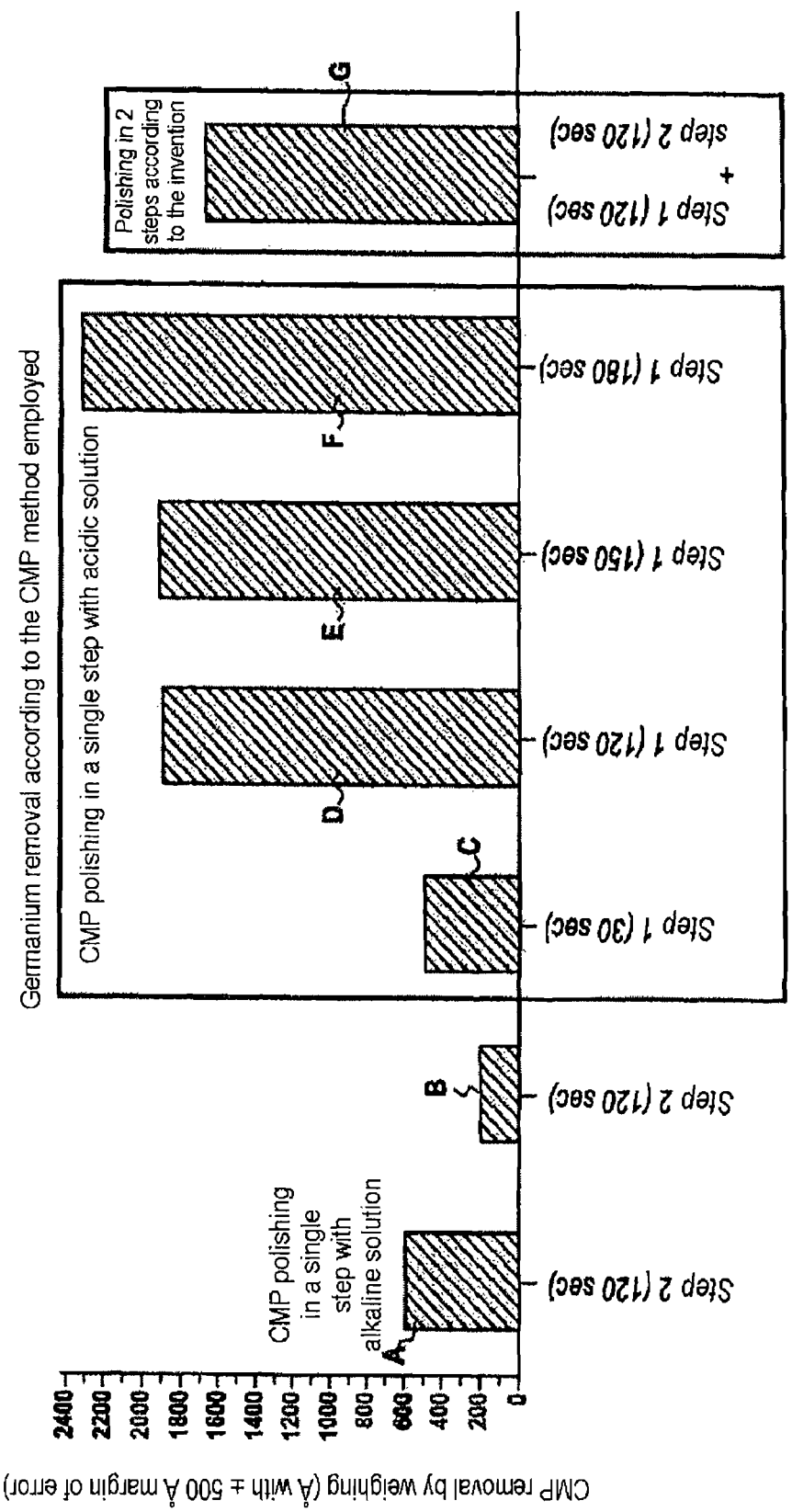
FIG. 5 is a histogram showing levels of germanium removal of the polishing operations carried out either in a single step, or in two steps according to the invention.

FIGS. 4 and 5 respectively represent the level of haze and the removal which are obtained after polishing a layer of germanium formed on a silicon substrate as in the heterostructure 12 described above, the chemical-mechanical polishing being carried out respectively:

- in a single step with a fabric and a polishing solution corresponding to those used in the second polishing step as described above (intermediate fabric and colloidal suspension of stabilized amorphous silica in an alkaline medium (Step 2)) (column A in FIG. 4 and columns A and B in FIG. 5)),
- in a single step with a fabric corresponding to that used in the first polishing step as described above (hard fabric and colloidal suspension of stabilized amorphous silica in an acidic medium) (Step 1)) and for polishing times of 30, 150, 180 and 120 seconds (columns B, C, D, E in FIG. 4 and columns C, D, E, F in FIG. 5), and
- in two steps according to the invention (first step with a hard fabric and colloidal suspension of stabilized amorphous silica in an acidic medium followed by a second step with an intermediate fabric and a colloidal suspension of stabilized amorphous silica in an alkaline medium (Step 1+Step 2)) (column F in FIG. 4 and column G in FIG. 5).

The haze values indicated in FIG. 4 were measured with an apparatus of the SP1 type from KLA-Tencor® while adjusting the detection threshold to 0.8 microns, that is to say the minimum size of detectable particles.

This figure clearly shows the gain obtained in the level of the haze when the chemical-mechanical polishing is carried out in two steps in accordance with the invention. Thus, the haze level after CMP polishing in two steps according to the invention is 0.43 ppm. The haze level is reduced by a factor of 17 compared with the haze level obtained with polishing in a single step carried out with a fabric and a polishing solution corresponding to those used in the first polishing step as described above (hard fabric and colloidal suspension of stabilized amorphous silica in an acidic medium) (column E). The haze level is reduced by a factor of 3 compared with the haze level obtained with polishing in a single step carried out with a fabric and a polishing solution corresponding to those used in the second polishing step as described above (intermediate fabric and colloidal suspension of stabilized amorphous silica in an alkaline medium) (column A).

FIG. 5 shows the various germanium removal factors obtained according to whether an alkaline or acidic polishing solution is used, or both (a margin of error of ±500 Å is to be taken into account for the removal values indicated in FIG. 5). Columns A and B show that with a polishing solution containing a colloidal suspension of stabilized amorphous silica in an alkaline medium, the rate of germanium removal is between 1.66 Å/sec and 5.1 Å/sec, approximately, whereas column D shows that it is approximately 15.8 Å/sec when using a polishing solution containing a colloidal suspension of stabilized amorphous silica in an acidic medium. The rate of germanium removal with an acidic polishing solution is greater than with an alkaline polishing solution.

The heteroepitaxial layers of SiGe, the results of which are presented in FIGS. 3 to 5, were polished with a Mirra polishing apparatus from Applied Materials with the following rotation rates Vt of the polishing and Vp of the polishing plate:
   first polishing step: Vt lying between 75 and 95 rpm, preferably 87 rpm, with a pressure applied to the polishing head of between 3 and 6 psi, preferably 4 psi; Vp between 85 and 100 rpm, preferably 93 rpm;
   second polishing step: Vt lying between 30 and 45 rpm, preferably 36 rpm, with a pressure applied to the polishing head of between 3 and 6 psi, preferably 4 psi; Vp between 25 and 40 rpm, preferably 30 rpm;

By employing two polishing steps under the conditions defined above, the polishing method of the present invention makes it possible to reduce considerably the defects resulting from the heteroepitaxy, the surface macroroughness (haze measurement) and microroughness (measurement using an atomic force microscope (AFM)). This improvement in the surface condition of the wafers makes it possible, in particular, to ensure good bonding by molecular adhesion of the heteroepitaxial germanium layer.

The polishing method of the invention may in particular be used advantageously for the fabrication of GeOI (germanium on insulator) structures according to the SmartCut® technology, which comprises forming a heteroepitaxial layer of germanium on a layer of silicon belonging to a donor substrate, bonding the exposed face of the germanium layer to a face of a receiver substrate and removing at least the silicon layer belonging to the donor substrate by polishing, etching and/or fracture along a weakened plane formed in the germanium layer during prior atom implantation. Before bonding the germanium layer to the receiver substrate, the exposed face of the germanium layer is polished in accordance with the polishing method of the invention in order to permit bonding by molecular adhesion.

However, the polishing method of the invention is not limited to the polishing of germanium layers formed by heteroepitaxy, and may also be used for polishing layers of bulk germanium (bulk Ge), for example during the fabrication of a GeOI structure as described above. In this case, the germanium layer transferred onto the receiver substrate is a bulk germanium layer whose surface can be polished before bonding onto the receiver substrate.

The method of the invention may furthermore be used on heteroepitaxial or bulk germanium layers in order to thin them and/or reduce their roughness after fracture along a weakened plane formed by prior atom implantation.

The polishing method of the invention makes it possible to eliminate enough germanium in order to compensate for the defects associated with epitaxy, ensure good bonding by molecular adhesion and obtain a better wafer quality during the fabrication of GeOI structures.

What is claimed is:

1. A method for polishing a heteroepitaxial structure having at least one surface layer of germanium, which comprises:
   a first step of chemical-mechanical polishing of the surface of the germanium layer carried out with a first polishing solution having an acidic pH and silica particles having a diameter between 40 nm and 60 nm and also with a polishing fabric having a first compressibility factor of between 2% and 4%, and a second step of chemical-mechanical polishing of the surface of the germanium layer with a second polishing solution having an alkaline pH and silica particles having a diameter between 30 nm and 40 nm and also with a polishing fabric having a second compressibility factor of between 5% and 9%,
   wherein after the second chemical-mechanical polishing step, the germanium layer has a surface microroughness of less than 0.1 nm RMS for a roughness measurement carried out using an atomic force microscope on scan areas of $2*2\ \mu m^2$ and $10*10\ \mu m^2$.

2. The method of claim 1, wherein the first and second polishing solutions respectively have a silica particle concentration of between 28 and 30%.

3. The method of claim 1, wherein the structure is a heterostructure comprising at least one heteroepitaxial surface layer of germanium on a substrate made of a material different from that of the heteroepitaxial layer.

4. The method of claim 3, wherein after the second chemical-mechanical polishing step, the heteroepitaxial germanium layer has a surface macroroughness corresponding to a surface haze level of less than 0.5 ppm.

5. The method of claim 1, wherein the first and second chemical-mechanical polishing steps are carried out using a polishing tool comprising a polishing head in which the structure is arranged, and a plate covered with a polishing fabric in contact with the surface of the germanium layer to be polished, and wherein the polishing solution is dispensed from the polishing head.

6. The method of claim 1, wherein the germanium layer is situated on a layer of silicon which is part of a donor substrate, with the germanium layer forming an exposed face of the donor substrate; and wherein the method further comprises:
   bonding the polished exposed face of the germanium layer to a face of a receiver substrate; and
   removing the silicon layer and the donor substrate to form a germanium on insulator structure.

7. The method of claim 6, wherein the receiver substrate is made of an insulator or has a surface layer of insulator material.

8. A method for polishing a heteroepitaxial structure having at least one surface layer of germanium to reduce surface roughness, which comprises:
   a first step of chemical-mechanical polishing of the surface of the germanium layer carried out with a first polishing solution having an acidic pH and first silica particles and also with a first polishing fabric a compressibility factor, and
   a second step of chemical-mechanical polishing of the surface of the germanium layer with a second polishing solution having an alkaline pH and second silica particles and also with a second polishing fabric having a compressibility factor,
   wherein the second silica particles have diameters falling within in a range that is smaller than those of the first silica particles and the compressibility factor of second polishing fabric is greater than that of the first polishing fabric.

9. The method of claim 8, wherein during the first polishing step, the polishing fabric has a first compressibility factor of between 2% and 4%.

10. The method of claim 8, wherein during the second polishing step, the polishing fabric has a second compressibility factor of between 5% and 9%.

11. The method of claim 8, wherein the silica particles of the first polishing solution have a diameter of between 40 nm and 60 nm.

12. The method of claim 8, wherein the silica particles of the second polishing solution have a diameter of between 30 nm and 40 mm.

13. The method of claim 8, wherein the first and second polishing solutions respectively have a silica particle concentration of between 28 and 30%.

14. The method of claim 8, wherein the structure is a heterostructure comprising at least one heteroepitaxial surface layer of germanium on a substrate made of a material different from that of the heteroepitaxial layer.

15. The method of claim 14, wherein after the second chemical-mechanical polishing step, the heteroepitaxial germanium layer has a surface macroroughness corresponding to a surface haze level of less than 0.5 ppm.

16. The method of claim 8, wherein the first and second chemical-mechanical polishing steps are carried out using a polishing tool comprising a polishing head in which the structure is arranged, and a plate covered with a polishing fabric in contact with the surface of the germanium layer to be polished, and wherein the polishing solution is dispensed from the polishing head.

17. The method of claim 8, wherein the germanium layer is situated on a layer of silicon which is part of a donor substrate, with the germanium layer forming an exposed face of the donor substrate; and wherein the method further comprises:
    bonding the polished exposed face of the germanium layer to a face of a receiver substrate; and
    removing the silicon layer and the donor substrate to form a germanium on insulator structure.

18. The method of claim 17, wherein the receiver substrate is made of an insulator or has a surface layer of insulator material.

* * * * *

UNITED STATES PATENT AND TRADEMARK OFFICE
CERTIFICATE OF CORRECTION

| | | |
|---|---|---|
| PATENT NO. | : 8,304,345 B2 | Page 1 of 1 |
| APPLICATION NO. | : 12/933666 | |
| DATED | : November 6, 2012 | |
| INVENTOR(S) | : Martinez et al. | |

It is certified that error appears in the above-identified patent and that said Letters Patent is hereby corrected as shown below:

Column 11:
Line 3 (claim 12, line 3), change "40 mm" to -- 40 nm --.

Signed and Sealed this
First Day of January, 2013

David J. Kappos
*Director of the United States Patent and Trademark Office*